United States Patent [19]

Allfather et al.

[11] 4,454,480

[45] Jun. 12, 1984

[54] AMPLIFYING WITH CASCADED CLASS B AMPLIFIERS

[76] Inventors: Lars P. Allfather; John E. Levreault, both of 85 Walnut St., Watertown, Mass. 02172

[21] Appl. No.: 283,686

[22] Filed: Jul. 15, 1981

[51] Int. Cl.³ .............................................. H03F 3/04
[52] U.S. Cl. ................................. 330/297; 330/310
[58] Field of Search ................ 330/297, 310, 295, 202

[56] References Cited

U.S. PATENT DOCUMENTS 4,115,739 9/1978 Sano et al. .......................... 330/297

*Primary Examiner*—James B. Mullins
*Assistant Examiner*—Gene Wan

*Attorney, Agent, or Firm*—Charles Hieken

[57] ABSTRACT

An electronic Class B master power amplifier is cascaded with a like slave Class B electronic power amplifier between ground and an output terminal to which the output of the slave amplifier is connected. A first pair of D.C. sources deliver potentials of magnitude $V_{ss}$ but opposite polarity to the master power amplifier and each have a reference terminal connected to ground. A second pair of D.C. sources deliver potentials of magnitude $V_{ss}$ but opposite polarity to the slave power amplifier, and each have a reference terminal connected to the output of the master amplifier. A common input signal to be amplified is delivered to the inputs of the master and slave amplifiers.

8 Claims, 12 Drawing Figures

U.S. Patent   Jun. 12, 1984   Sheet 1 of 6   4,454,480
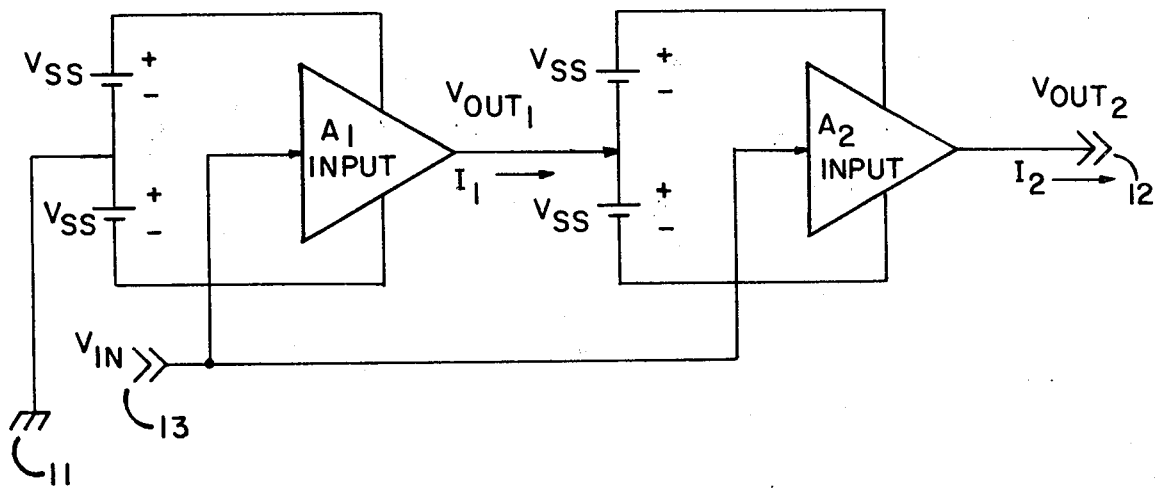
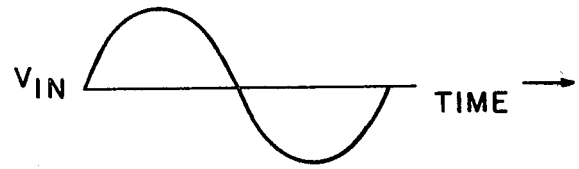
FIG. 1B
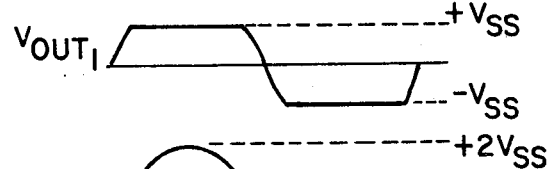
FIG. 1C
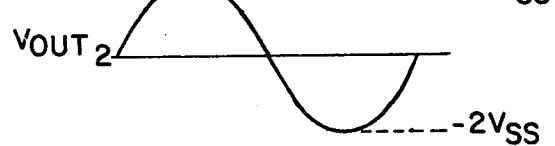
FIG. 1D
$$I_1 = I_2$$
$$\frac{V_{OUT_2}}{V_{IN}} = A_{V_1} = A_{V_2}$$
FIG. 1

$$I_1 = I_2$$

$$\frac{V_{OUT}}{V_{IN}} = A_{V_1} + A_{V_2}$$

4,454,480

AMPLIFYING WITH CASCADED CLASS B AMPLIFIERS

The present invention relates in general to amplifying and more particularly concerns novel apparatus and techniques for combining amplifiers so as to multiply the output voltage swing and power output of a single amplifier while facilitating impedance matching loads.

The output voltage swing of a conventional power amplifier is limited by the D.C. supply voltage. When the input voltage drives the output voltage to the limiting level, a further increase in voltage swing produces no further increase in output voltage, and signal clipping occurs. Increasing the D.C. supply voltage to increase the available swing is costly.

An example of cascaded voltage followers comprising operational amplifiers used in an interface circuit is disclosed in published U.K. patent application GB 2038127A published July 16, 1980.

It is an important object of this invention to provide improved amplifying.

According to the invention, there are first and second amplifying means cascaded between an output terminal and a common terminal. The D.C. power supply for energizing the second amplifying means includes a reference terminal connected to the output of the first amplifying means. The first and second amplifying means each have a signal input, and there is a means for coupling a common input signal for amplification to these signal inputs. The invention may be adapted for cascading a number of amplifying means in series arrangements, parallel arrangements and series-parallel arrangements. Preferably the amplifying means are class B electronic power amplifiers.

Numerous other features, objects and advantages of the invention will become apparent from the following specification when read in connection with the accompanying drawing in which:

FIG. 1A is a block diagram illustrating the logical arrangement of an embodiment of the invention having two cascaded Class B power amplifiers;

FIGS. 1B, 1C and 1D are graphical representations to a common time scale of the input signal waveform, and the voltages at the outputs of the first and second amplifiers, respectively;

Figures 2, 2A, 2B, 2C, 2D:
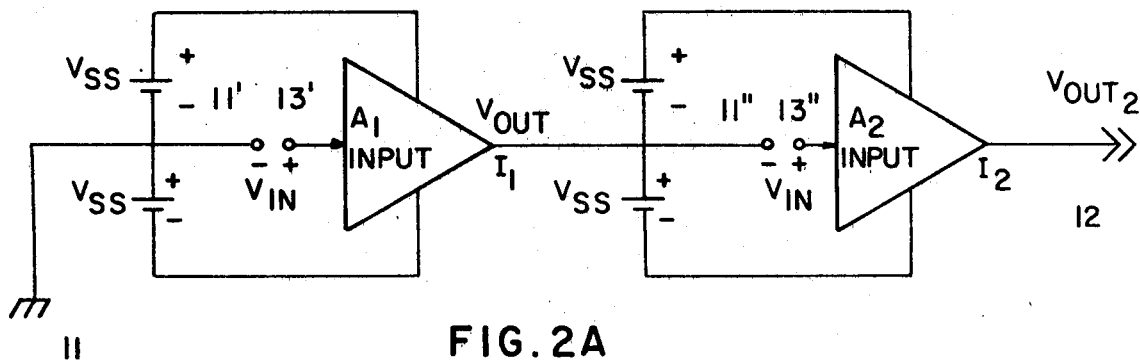
FIG. 2A is a variation of the embodiment of FIG. 1 in which the amplifiers are driven with input voltages referenced to their own isolated power supply commons.
FIGS. 2B, 2C and 2D are graphical representations to a coommon time scale of the input voltage, output voltage of the first amplifier and output voltage of the second amplifier, respectively.

With reference now to the drawing and more particularly FIG. 1A thereof, there is shown a block diagram illustrating the logical arrangement of a system according to the invention having two identical class B electronic voltage power amplifiers $A_1$ and $A_2$ connected between common terminal 11 and output terminal 12 for amplifying an input signal shown in FIG. 1B applied at input terminal 13 to provide the output signal shown in FIG. 1D at output terminal 12 referenced to common terminal 11. Each of the D.C. voltage sources are represented by batteries providing D.C voltages of magnitude $V_{ss}$ polarized as indicated. The resultant amplifier system accommodates twice the output voltage swing and provides twice the power output of a single amplifier. Yet, the system uses transistors and many other components with voltage ratings the same as those for a single amplifier.

For convenience in explaining the principles of operation, the voltage waveforms shown in FIGS. 1B–1D assume that amplifiers $A_1$ and $A_2$ are ideal class B amplifiers. With the inputs of amplifiers $A_1$ and $A_2$ energized in parallel from input terminal 13, the system voltage gain and maximum power efficiency is the same as that for an individual amplifier.

FIG. 1C shows the clipped output signal waveform at the output of amplifier $A_1$ when the input voltage drives the amplifier to an amplitude greater than $V_{ss}$. Because the D.C. voltage sources energizing amplifier $A_2$ have a floating ground referenced to the output of amplifier $A_1$, the output voltage at terminal 12 at the output of amplifier $A_2$ does not clip so long at this output voltage is of magnitude less than or equal to $2V_{ss}$ as indicated in FIG. 1D. The output current $I_1$ from amplifier $A_1$ is the same as the output current $I_2$ from amplifier $A_2$.

Referring to FIG. 2A, there is shown an alternate embodiment of the invention in which amplifiers $A_1$ and $A_2$ are driven with input voltages applied between terminals 11' and 13' and 11" and 13", respectively, referenced to their own isolated power supply common terminals 11' and 11", respectively. Then the power dissipated by amplifiers $A_1$ and $A_2$ is equalized for any output voltage operating point. In this embodiment the system voltage gain is twice the gain of an individual amplifier. Also, the common mode input voltage impressed on each amplifier input, with respect to its power supply common terminal, is minimized. The specific means for providing the input voltages in this manner may comprise a lower-power differential amplifier, an isolation amplifier, or an isolation transformer if direct coupling is not needed.

FIG. 2B shows the common input voltage applied between terminals 11' and 13' and between terminals 11" and 13" to produce a swing of $2V_{ss}$ at output terminal 12 resulting in a voltage swing of $V_{ss}$ at the output of amplifier $A_1$. The output current $I_1$ from amplifier $A_1$ is the same as the output current $I_2$ from amplifier $A_2$.

Figure 3:
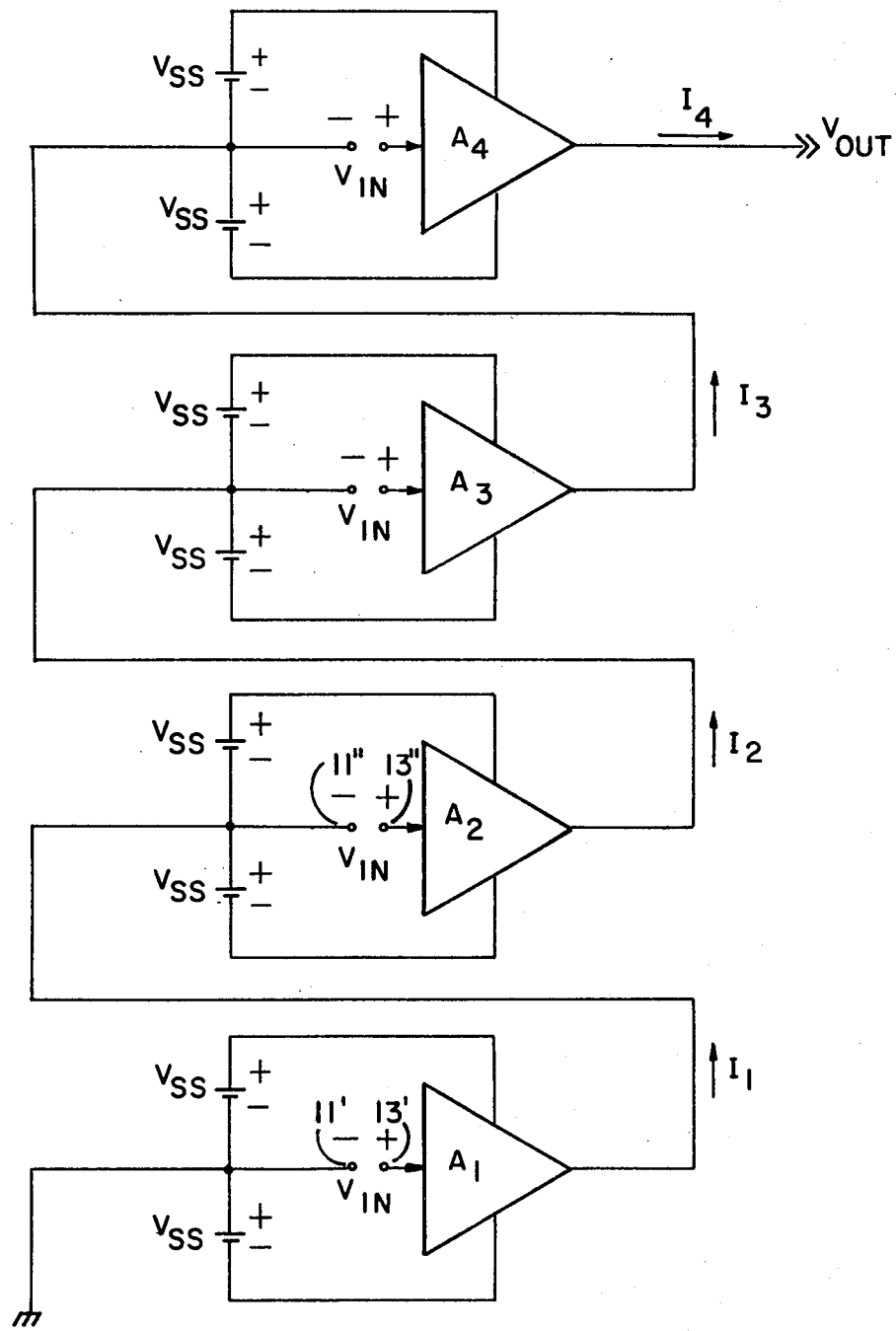
FIG. 3 is a block diagram illustrating the logical arrangement of an alternative embodiment of the invention having four cascaded amplifiers.

The techniques described above may be applied to any number N of amplifiers. Referring to FIG. 3, there is shown an exemplary embodiment of the invention with four amplifiers $A_1$, $A_2$, $A_3$, and $A_4$, each driven with input voltages referenced to their own isolated power supply common terminals as in the system of FIG. 2A. The input-to-output voltage gain is N times the gain of a single stage. The output currents $I_1$, $I_2$, $I_3$ and $I_4$ from amplifiers $A_1$–$A_4$, respectively, are the same. As in the system of FIG. 2 this arrangement equalizes power dissipation among the four amplifiers. This system accommodates a voltage swing of $4V_{ss}$.

It is known that identical linear power voltage amplifiers may have their inputs and outputs paralled if resistors are added in series with their output stages to compensate for small differences in parameters, such as offsets and gains. The closer the match between the amplifiers, the smaller the resistors may be and the smaller the errors and deficiencies they add. The invention may be employed with parallelling amplifiers to perform the function of impedance matching to loads. Since the embodiment of FIG. 3 can deliver four times the output voltage of a single amplifier at the same current, the system can deliver maximum power into a load impedance four times greater than that of a single amplifier.

Figure 4:
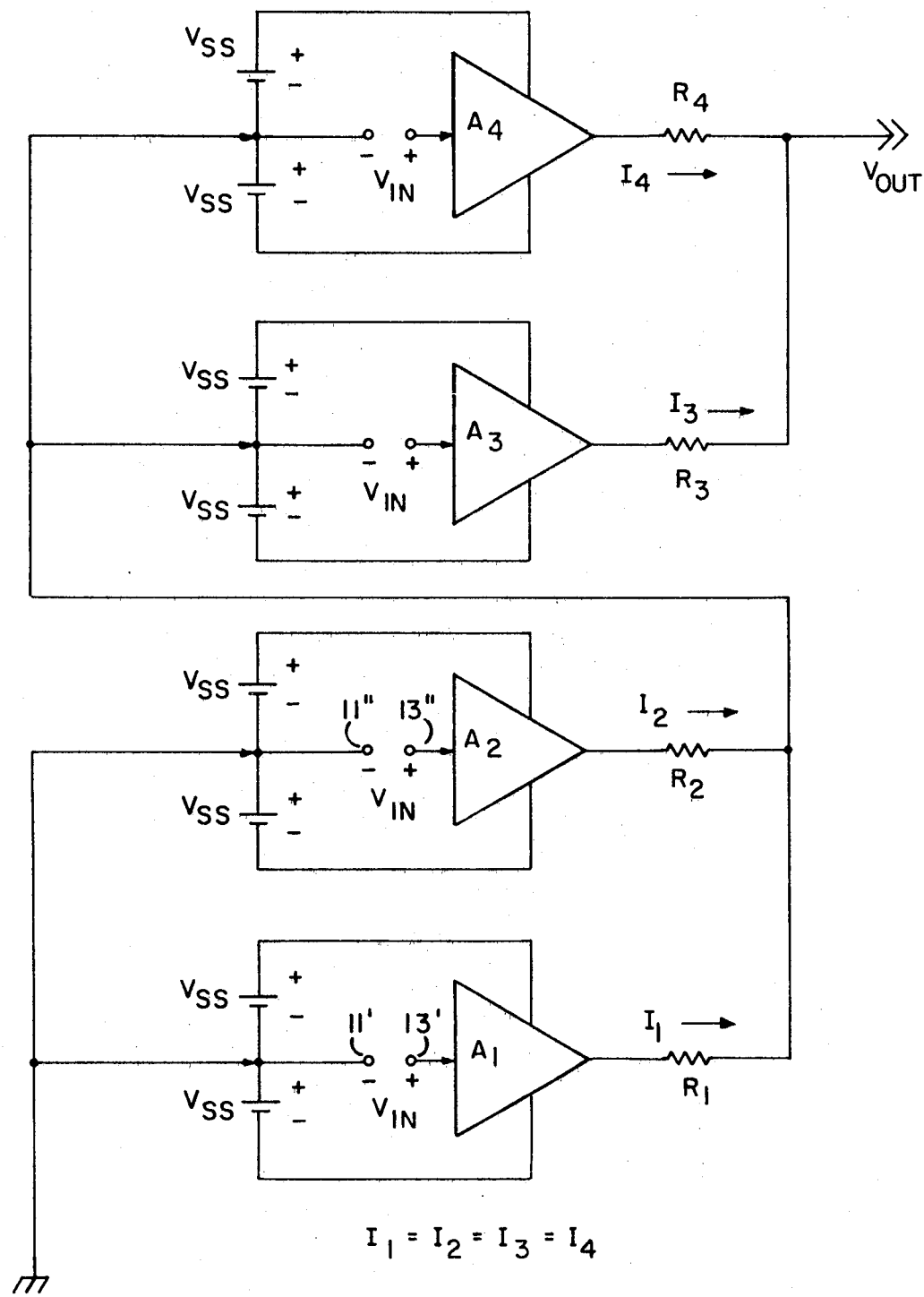
FIG. 4 illustrates another embodiment of the invention having four amplifiers in series-parallel.

Referring to FIG. 4, there is shown an embodiment of the invention in which the output of each of amplifiers $A_1$–$A_4$ is connected to a respective equalizing resistance $R_1$–$R_4$ of value R. Amplifiers $A_1$ and $A_2$ with associated resistors $R_1$ and $R_2$ and amplifiers $A_3$ and $A_4$ with associated resistors $R_3$ and $R_4$ are connected in parallel, and these parallel combinations are connected in series between common terminal 11 and output terminal 12. The output currents $I_1$–$I_4$ are equal, and the system voltage gain is twice that of an individual amplifier. Assuming the equalizing resistors having negligible performance effect, the system delivers twice the output voltage of a single amplifier at twice the current to deliver maximum power into a load impedance equal to that of a single amplifier.

Figure 5:
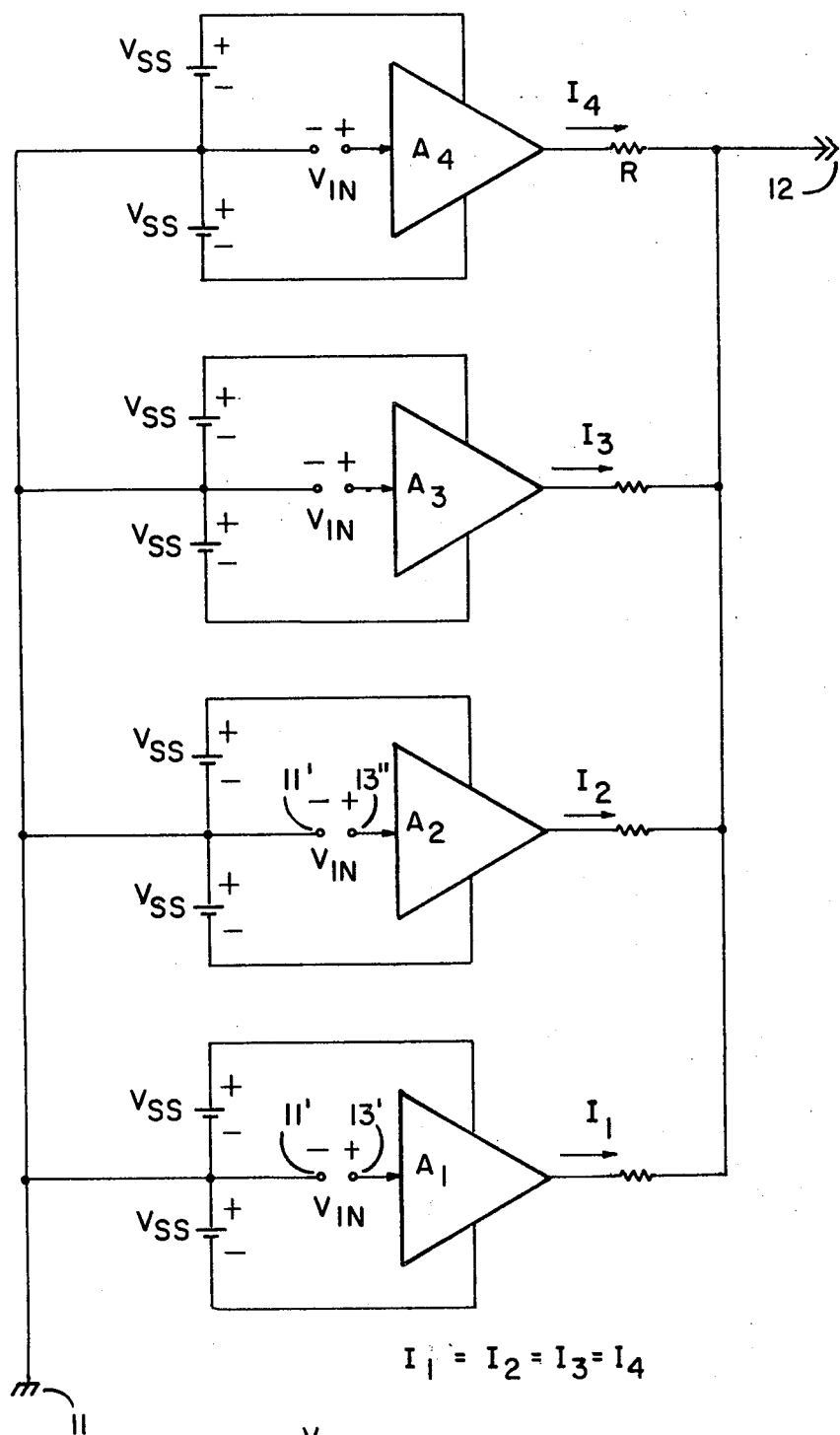
FIG. 5 is still another embodiment of the invention having four amplifiers in parallel.

Referring to FIG. 5, there is shown an alternate arrangement of the amplifiers of FIG. 4 in which the four amplifiers with associated equalizing resistors are connected in parallel between output terminal 12 and common terminal 11. The voltage gain of the system is then that of a single amplifier, and the system delivers maximum power into a load impedance equal to that of one-fourth a single amplifier ($Z_L/4$).

Figure 6:
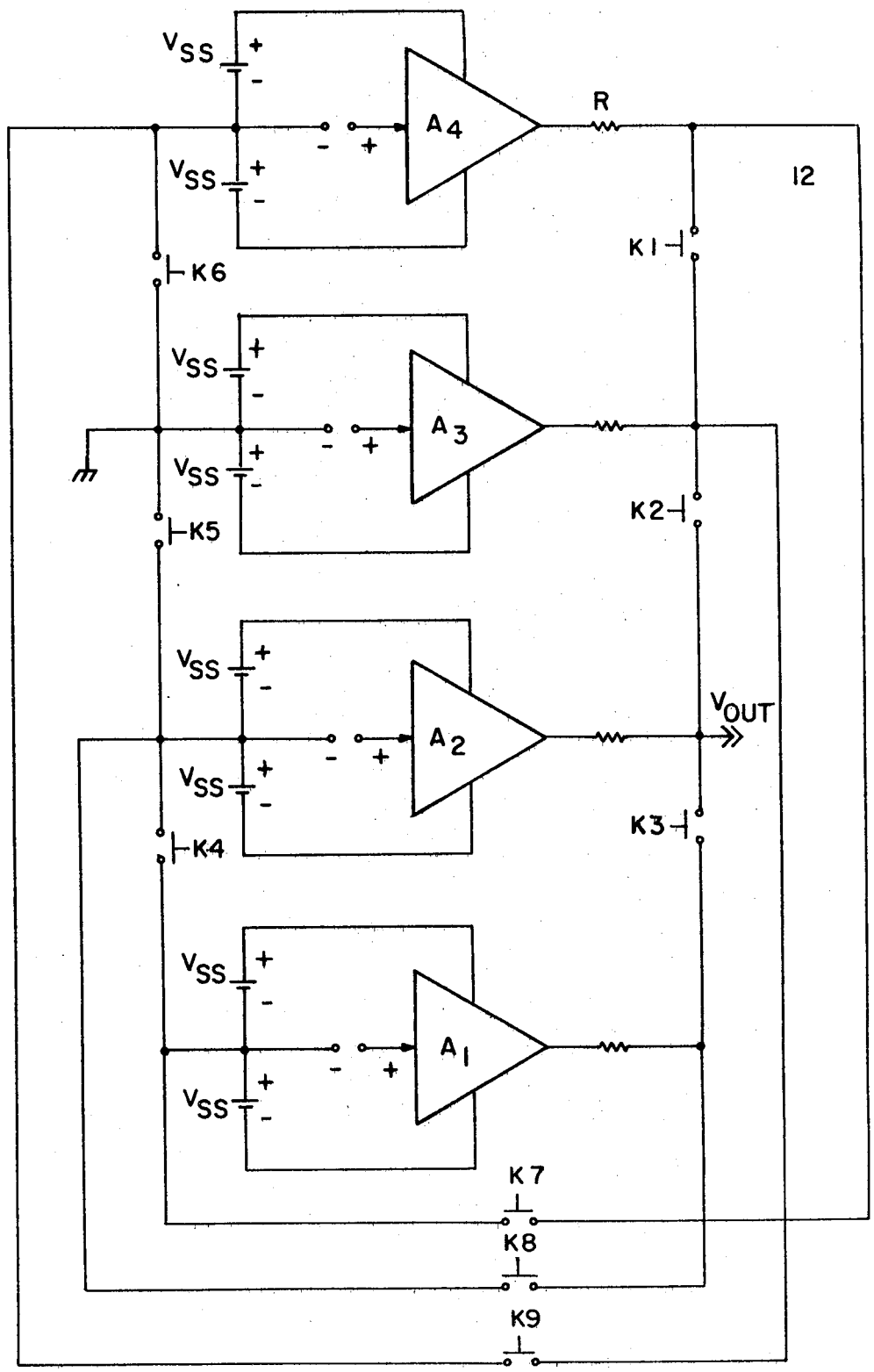
FIG. 6 shows the logical arrangement of four amplifiers with suitable switching means to enable the features of the systems of FIGS. 3–5 to be achieved through appropriate actuation of the different switches.

Referring to FIG. 6, there is shown an embodiment of the invention with the four amplifiers and nine switches $K_1$–$K_9$ connected as shown for selectively implementing all the combinations shown in FIGS. 3–5. The switches may be electronic or mechanical. Table 1 below shows the switch combinations and ratings for creating the various configurations. For A.C. signals the system of FIG. 6 may be used to eliminate an impedance matching output transformer. If the amplifiers are direct coupled, the system may be used for direct coupled impedance matching.

The system of FIG. 6 may be extended to any number N of amplifiers. Table 2 below illustrates a sample of the ranges available from combinations of more than four amplifiers.

TABLE 1

| Systems | Max I-Output | Max V-Output | Max Power Load | I Through Closed Switches |
|---|---|---|---|---|
| 1 | 4I | V | $1/4Z_L$ | $K_1,K_3,K_4,K_6 = I$ $K_5,K_2 = 2I$ |
| 2 | 2I | 2V | $Z_L$ | $K_1,K_3,K_4,K_6 = I$ |
| 3 | I | 4V | $4Z_L$ | $K_7,K_8,K_9 = I$ |

TABLE 2

| Number of Amplifiers | Z Ranges for Maximum Power |
|---|---|
| 1 | $Z_L$ |
| 2 | $2Z_L, 1/2Z_L$ |
| 3 | $3Z_L, 1/3Z_L$ |
| 4 | $4Z_L, Z_L, 1/4Z_L$ (as shown) |
| 5 | $5Z_L, 1/5Z_L$ |
| 6 | $6Z_L, 3/2Z_L, 2/3Z_L, 1/6Z_L$ |
| 7 | $7Z_L, 1/7Z_L$ |
| 8 | $8Z_L, 2Z_L, 1/2Z_L, 1/8Z_L$ |
| 9 | $9Z_L, Z_L, 1/9Z_L$ |
| 10 | $10Z_L, 5/2Z_L, 2/5Z_L, 1/10Z_L$ |
| 11 | $11Z_L, 1/11Z_L$ |
| 12 | $12Z_L, 3Z_L, 4/3Z_L, 3/4Z_L, 1/3Z_L, 1/2Z_L$ |

TABLE 2-continued

| Number of Amplifiers | Z Ranges for Maximum Power |
|---|---|
| 13 | $13Z_L, 1/13Z_L$ |

There has been described novel apparatus and techniques for providing improved amplification. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited by the spirit and scope of the appended claims.

What is claimed is:

1. Amplifying apparatus comprising,
   at least first and second class B amplifying means each having an input and an output,
   a common terminal and an output terminal, means for applying a common input signal to said first and second amplifying means inputs,
   a first source of D.C. potentials connected to said common terminal delivering D.C. power to said first amplifying means,
   a second source of D.C. potentials connected to the output of said first amplifying means delivering D.C. power to said second amplifying means,
   and means for coupling the output of said second amplifying means to said output terminal for providing between said output terminal and said common terminal an output signal corresponding to said common input signal substantially faithfully amplified at a predetermined impedance level with the output current at the output of the first amplifying means substantially equal to the output current at the output of said second amplifying means.

2. Amplifying apparatus in accordance with claim 1 wherein said first and second amplifying means are like Class B electronic power amplifiers.

3. Amplifying apparatus in accordance with claim 1 wherein said first source of D.C. potentials has a reference terminal connected to said common terminal and said second source of D.C. potential has a reference terminal connected to the output of said first amplifying means and floats with the potential thereat.

4. Amplifying apparatus in accordance with claim 3 wherein each said amplifying means are like electronic power amplifiers.

5. Amplifying apparatus in accordance with claim 4 and further comprising first and second sources of said common input signal coupled to the inputs of said first and second amplifying means respectively with each of the latter sources having a reference terminal isolated from the reference terminal of the other.

6. Amplifying apparatus in accordance with claim 1 and further comprising an equalizing resistance in series with the output of each of said amplifying means for facilitating connecting at least two of said amplifying means in parallel between said output terminal and said common terminal,
   and means for coupling at least two of said amplifying means in parallel for establishing a predetermined selected output impedance between said output terminal and said common terminal.

7. Amplifying apparatus in accordance with claim 6 and further comprising switching means for selectively intercoupling said amplifying means to establish any of a predetermined set of output impedance levels between said output terminal and said common terminal.

8. Amplifying apparatus in accordance with claim 1 wherein each of said D.C. potentials is of substantially the same magnitude.

* * * * *